US011262417B2

(12) United States Patent
Lee

(10) Patent No.: US 11,262,417 B2
(45) Date of Patent: Mar. 1, 2022

(54) APPARATUS AND METHOD FOR TESTING CIRCUIT BOARD INCLUDED IN BATTERY MANAGEMENT SYSTEM

(71) Applicant: LG Chem, Ltd., Seoul (KR)

(72) Inventor: Won-Jae Lee, Daejeon (KR)

(73) Assignee: LG Energy Solution, Ltd.

(*) Notice: Subject to any disclaimer, the term of this patent is extended or adjusted under 35 U.S.C. 154(b) by 60 days.

(21) Appl. No.: 16/771,734

(22) PCT Filed: Mar. 20, 2019

(86) PCT No.: PCT/KR2019/003262
§ 371 (c)(1),
(2) Date: Jun. 11, 2020

(87) PCT Pub. No.: WO2020/004774
PCT Pub. Date: Jan. 2, 2020

(65) Prior Publication Data
US 2021/0156929 A1    May 27, 2021

(30) Foreign Application Priority Data

Jun. 29, 2018   (KR) .................. 10-2018-0075764

(51) Int. Cl.
G01R 31/64         (2020.01)
G01R 31/28         (2006.01)
(Continued)

(52) U.S. Cl.
CPC ......... G01R 31/64 (2020.01); G01R 31/2812 (2013.01); H01M 10/4285 (2013.01); H01M 10/48 (2013.01); G01R 31/71 (2020.01)

(58) Field of Classification Search
CPC ............ Y02E 60/10; H01M 10/482; H01M 2010/4271; H01M 10/488; H01M 50/284;
(Continued)

(56) References Cited

U.S. PATENT DOCUMENTS 5,654,644 A     8/1997  Zydek et al.
6,624,640 B2*   9/2003  Lund .................. G01R 27/2605
                                                    324/658
(Continued)

FOREIGN PATENT DOCUMENTS

CN    104777419 A    7/2015
CN    107430165 A    12/2017
(Continued)

OTHER PUBLICATIONS

Extended European Search Report for Application No. 19825696.8, dated Mar. 3, 2020, 8 pages.
(Continued)

Primary Examiner — Vinh P Nguyen
(74) Attorney, Agent, or Firm — Lerner, David, Littenberg, Krumholz & Mentlik, LLP

(57) ABSTRACT

An apparatus and method for testing a circuit board included in a battery management system. The circuit board includes a first test point connected in common to one end of a first resistor, one end of a first capacitor and one end of a second resistor; a second test point connected in common to the other end of the second resistor and one end of a second capacitor; a third test point connected to the other end of the first resistor; and a fourth test point connected in common to the other end of the first capacitor and the other end of the second capacitor. The apparatus determines an open-circuit fault of at least one of the first capacitor and the second capacitor based on a first diagnosis voltage between the first and fourth test points and a second diagnosis voltage between the second and fourth test points.

12 Claims, 8 Drawing Sheets

(51) Int. Cl.
*H01M 10/42* (2006.01)
*H01M 10/48* (2006.01)
*G01R 31/71* (2020.01)

(58) Field of Classification Search
CPC ......... H01M 10/4285; H01M 10/4207; H01M 6/5083; H01M 10/4264; H01M 10/48; G01R 31/392; G01R 31/396; G01R 31/3835; G01R 31/3647; G01R 31/52; G01R 31/50; G01R 31/71; G01R 31/36; G01R 31/2812; G01R 31/54; G01R 31/389; G01R 19/16542; G01R 31/2879; G01R 31/64; G01R 31/70; G01R 1/0416; G01R 31/67; G01R 31/66; G01R 1/0408; G01R 19/0084
See application file for complete search history.

(56) References Cited

U.S. PATENT DOCUMENTS

| | | | |
|---|---|---|---|
| 8,547,132 B2 * | 10/2013 | Kim | H05K 1/0268 324/763.01 |
| 8,872,522 B2 | 10/2014 | Saloio | |
| 8,941,394 B2 * | 1/2015 | Martin | G06F 3/044 324/681 |
| 9,823,292 B2 | 11/2017 | Onishi et al. | |
| 9,876,369 B2 * | 1/2018 | McCormick | H02J 7/0016 |
| 2002/0153901 A1 | 10/2002 | Davis et al. | |
| 2006/0214810 A1 | 9/2006 | Alvord | |
| 2011/0215828 A1 | 9/2011 | Kim et al. | |
| 2011/0273202 A1 | 11/2011 | Kim et al. | |
| 2012/0150459 A1 | 6/2012 | Kim et al. | |
| 2012/0153966 A1 | 6/2012 | Kawamura | |
| 2012/0268080 A1 | 10/2012 | Jeon et al. | |
| 2013/0342215 A1 | 12/2013 | Kawamura | |
| 2015/0198641 A1 | 7/2015 | Moon | |
| 2015/0355261 A1 | 12/2015 | Tubul et al. | |
| 2018/0052207 A1 | 2/2018 | Kanai et al. | |

FOREIGN PATENT DOCUMENTS

| | | |
|---|---|---|
| JP | H04151571 A | 5/1992 |
| JP | 2012132725 A | 7/2012 |
| JP | 2012189378 A | 10/2012 |
| JP | 5242980 B2 | 7/2013 |
| KR | 20060029268 A | 4/2006 |
| KR | 20070114279 A | 11/2007 |
| KR | 100845252 B1 | 7/2008 |
| KR | 20110100793 A | 9/2011 |
| KR | 101085752 B1 | 11/2011 |
| KR | 20120120706 A | 11/2012 |
| KR | 101295182 B1 | 8/2013 |
| KR | 101711014 B1 | 2/2017 |
| KR | 20170059741 A | 5/2017 |
| WO | 9400322 A1 | 1/1994 |

OTHER PUBLICATIONS

International Search Report for Application No. PCT/KR2019/003262 dated Jun. 20, 2019, 2 pages.

Chinese Search Report for Application No. 201980005698.7 dated Nov. 4, 2021, 3 Pages.

* cited by examiner

APPARATUS AND METHOD FOR TESTING CIRCUIT BOARD INCLUDED IN BATTERY MANAGEMENT SYSTEM

CROSS-REFERENCE TO RELATED APPLICATIONS

The present application is a national phase entry under 35 U.S.C. § 371 of International Application No. PCT/KR2019/003262 filed Mar. 20, 2019, published in Korean, which claims priority from 10-2018-0075764 filed Jun. 29, 2018, all of which are incorporated herein by reference.

TECHNICAL FIELD

The present disclosure relates to an apparatus and method for testing whether a capacitor mounted on a circuit board included in a battery management system has an open-circuit fault.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of free charging and discharging, a very low self-discharge rate and high energy density.

A battery management system includes a circuit board on which components necessary to control and protect batteries, such as passive elements or active elements, are mounted. Typically, the passive elements include a resistor and a capacitor. The resistor is primarily used to interrupt an overcurrent to the batteries or peripheral circuitry according to the Ohm's law, and the capacitor is primarily used to smooth the voltage applied to the batteries or peripheral circuitry.

Automated optical inspection (AOI) can inspect the mounted condition of the components mounted on the circuit board in a short time using images of the circuit board collected in 2 or 3 dimensions, and is widely used due to its advantage, but cannot perfectly detect an open-circuit fault of the capacitor.

SUMMARY

Technical Problem

The present disclosure is designed to solve the above-described problem, and therefore the present disclosure is directed to providing an apparatus and method for testing an open-circuit fault of a capacitor mounted on a circuit board included in a battery management system.

These and other objects and advantages of the present disclosure may be understood by the following description and will be apparent from the embodiments of the present disclosure. Further, it will be readily understood that the objects and advantages of the present disclosure may be realized by the means set forth in the appended claims and combinations thereof.

Technical Solution

An apparatus according to an aspect of the present disclosure is for testing a circuit board of a battery management system. The circuit board includes a first resistor; a first capacitor; a second resistor; a second capacitor; a first test point connected to a first end of the first resistor, a first end of the first capacitor and a first end of the second resistor; a second test point connected to a second end of the second resistor and a first end of the second capacitor;

a third test point connected to a second end of the first resistor; and a fourth test point connected to a second end of the first capacitor and a second end of the second capacitor. The apparatus includes a voltage source configured to selectively generate a test voltage, a first voltage sensor configured to detect a first diagnosis voltage generated between the first test point and the fourth test point, a second voltage sensor configured to detect a second diagnosis voltage generated between the second test point and the fourth test point, and a control unit operably coupled to the voltage source, the first voltage sensor and the second voltage sensor. The control unit is configured to control the voltage source to apply the test voltage onto the third test point. The control unit is configured to determine whether at least one of the first capacitor and the second capacitor has an open-circuit fault based on at least one of the first diagnosis voltage and the second diagnosis voltage.

The control unit may be configured to record a first time point when the first diagnosis voltage reaches a preset threshold voltage that is lower than the test voltage. The control unit may be configured to determine that both the first capacitor and the second capacitor do not have the open-circuit fault, based on a first elapsed period from an initial time point to the first time point being equal to or longer than a preset first threshold period. The initial time point is a time point when the test voltage starts to be applied onto the third test point.

The control unit may be configured to determine that the second capacitor has the open-circuit fault and that the first capacitor does not have the open-circuit fault, based on the first elapsed period being shorter than the first threshold period and equal to or longer than a preset first monitoring period.

The control unit may be configured to determine that the first capacitor has the open-circuit fault and that the second capacitor does not have the open-circuit fault, based on the first elapsed period being shorter than the first monitoring period and equal to or longer than a preset second monitoring period.

The control unit may be configured to determine that both the first capacitor and the second capacitor have the open-circuit fault, based on the first elapsed period being shorter than the second monitoring period.

The control unit may record a second time point when the second diagnosis voltage reaches the threshold voltage. The control unit may be configured to determine that at least the second capacitor has the open-circuit fault, based the first time point and the second time point being concurrent.

The control unit may record a second time point when the second diagnosis voltage reaches the threshold voltage. The control unit may be configured to determine that both the first capacitor and the second capacitor do not have the open-circuit fault, based a second elapsed period from the initial time point to the second time point being equal to or longer than a second preset threshold period that is longer than the first threshold period.

The control unit may be configured to output a diagnosis message indicating a result of the determination.

A method according to another aspect of the present disclosure is for testing a circuit board of a battery management system. The circuit board includes a first resistor; a first capacitor; a second resistor; a second capacitor; a first test point connected to a first end of the first resistor, a first end of the first capacitor and a first end of the second resistor; a second test point connected to a second end of the second resistor and a first of the second capacitor; a third test point connected to a second end of the first resistor; and a fourth test point connected to a second end of the first capacitor and a second end of the second capacitor. The method includes controlling, by a control unit, a voltage source to apply a test voltage onto the third test point, recording, by the control unit, a time point when a first diagnosis voltage generated between the first test point and the fourth test point reaches a preset threshold voltage that is lower than the test voltage, and outputting a diagnosis message indicating that both the first capacitor and the second capacitor do not have an open-circuit fault, based on an elapsed period from an initial time point to the recorded time point being equal to or longer than a preset first threshold period. The initial time point is a time point when the test voltage starts to be applied onto the third test point.

The method may further include outputting a diagnosis message indicating that the second capacitor has the open-circuit fault and that the first capacitor does not have the open-circuit fault, based on the elapsed period being shorter than the first threshold period and equal to or longer than a preset first monitoring period.

The method may further include outputting a diagnosis message indicating that the first capacitor has the open-circuit fault and that the second capacitor does not have the open-circuit fault, based on the elapsed period being shorter than the first monitoring period and equal to or longer than a preset second monitoring period.

The method may further include outputting a diagnosis message indicating that both the first capacitor and the second capacitor have the open-circuit fault, based on the elapsed period being shorter than the second monitoring period.

Advantageous Effects

According to at least one of the embodiments of the present disclosure, it is possible to test an open-circuit fault of a capacitor mounted on a circuit board included in a battery management system without a process of capturing and analyzing an image of the circuit board.

Additionally, according to at least one of the embodiments of the present disclosure, it is possible to detect an open-circuit fault of at least one of two capacitors included in a second-order RC filter by applying a single test signal.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
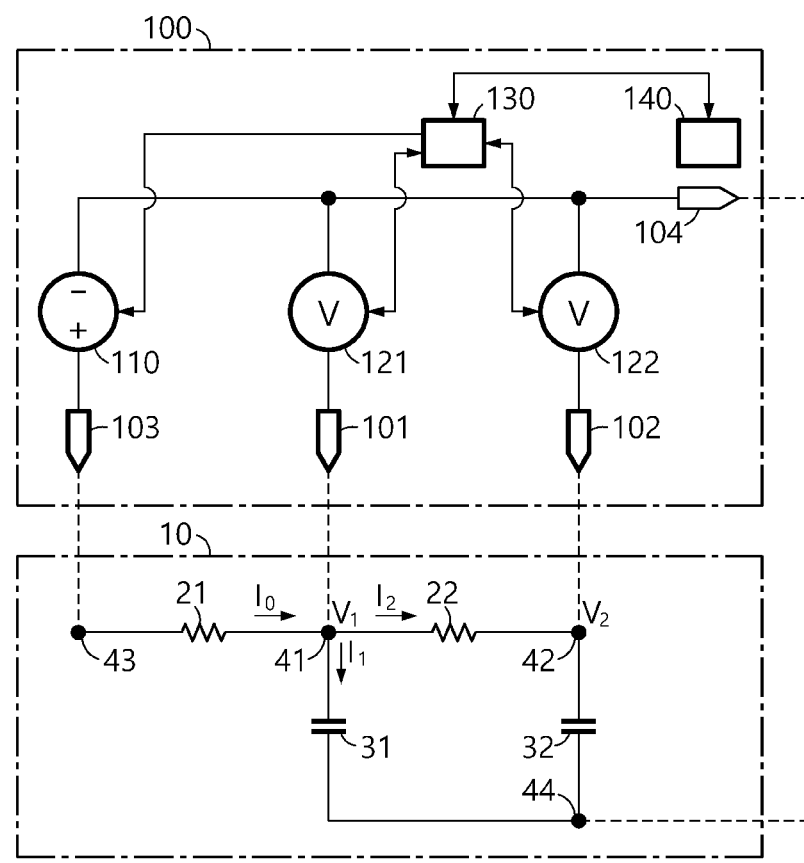
FIG. 1 is an exemplary diagram showing configurations of a circuit board included in a battery management system and an apparatus for testing the circuit board according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term "control unit" as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

FIG. 1 is an exemplary diagram showing configurations of a circuit board 10 included in a battery management system and an apparatus 100 for testing the circuit board 10 according to an embodiment of the present disclosure.

Referring to FIG. 1, the circuit board 10 includes a first resistor 21, a second resistor 22, a first capacitor 31, a second capacitor 32, a first test point 41, a second test point 42, a third test point 43 and a fourth test point 44. Each of the first resistor 21, the second resistor 22, the first capacitor 31, the second capacitor 32, the first test point 41, the second test point 42, the third test point 43 and the fourth test point 44 is mounted on the circuit board 10, for example, by soldering, etc.

The first test point 41 is formed among the first resistor 21, the first capacitor 31 and the second resistor 22. In detail, one end of the first resistor 21, one end of the first capacitor 31 and one end of the second resistor 22 are connected to the first test point 41 in common.

The second test point 42 is formed between the second resistor 22 and the second capacitor 32. In detail, the other end of the second resistor 22 and one end of the second capacitor 32 are connected to the second test point 42 in common.

The third test point 43 is connected to the other end of the first resistor 21. The third test point 43 is a designated location on the circuit board 10 to which a test voltage is applied as a test signal used to detect an open-circuit fault of the first capacitor 31 and the second capacitor 32.

The fourth test point 44 is formed between the other end of the first capacitor 31 and the other end of the second capacitor 32. In detail, the other end of the first capacitor 31 and the other end of the second capacitor 32 are connected to the fourth test point 44 in common. The fourth test point 44 may be connected to the ground terminal of the circuit board 10.

The first resistor 21, the second resistor 22, the first capacitor 31 and the second capacitor 32 that are electrically interconnected through the first test point 41, the second test point 42, the third test point 43 and the fourth test point 44 as described above may act as a second-order RC filter circuit. That is, the first resistor 21 and the first capacitor 31 may act as a first-order RC filter, the second resistor 22 and the second capacitor 32 may act as another first-order RC filter, and the two first-order RC filters may be connected through the first test point 41 to implement a second-order RC filter.

The apparatus 100 includes a voltage source 110, a first voltage sensor 121, a second voltage sensor 122, a control unit 130 and an information output unit 140. Optionally, the apparatus 100 may further include a first test pin 101, a second test pin 102, a third test pin 103 and a fourth test pin 104. The first test pin 101, the second test pin 102, the third test pin 103 and the fourth test pin 104 are arranged such that they may contact the first test point 41, the second test point 42, the third test point 43 and the fourth test point 44 at the same time respectively.

The voltage source 110 is configured to selectively generate the test voltage according to a command from the control unit 130. The test voltage may be, for example, a pulse voltage. The voltage source 110 outputs the test voltage (for example, 2 V) in response to an ON command from the control unit 130, and stops outputting the test voltage in response to an OFF command from the control unit 130. The third test pin 103 is connected to the high potential terminal of the voltage source 110, and the fourth test pin 104 may be connected to the low potential terminal of the voltage source 110. When the test voltage is applied to the third test point 43 by the voltage source 110, the current $I_0$ flowing from the third test point 43 to the first test point 41 branches into $I_1$ and $I_2$ at the first test point 41. That is, the current $I_0$ is larger than the current $I_1$ and the current $I_2$, and is equal to the sum of the current $I_1$ and the current $I_2$.

One end of the first voltage sensor 121 may contact the first test point 41 directly or through the first test pin 101, and the other end of the first voltage sensor 121 may contact the fourth test point 44 directly or through the fourth test pin 104. The first voltage sensor 121 is configured to detect a first diagnosis voltage $V_1$ generated between the first test point 41 and the fourth test point 44, and output a voltage signal indicating the detected first diagnosis voltage $V_1$ to the control unit 130.

One end of the second voltage sensor 122 may contact the second test point 42 directly or through the second test pin 102, and the other end of the second voltage sensor 122 may contact the fourth test point 44 directly or through the fourth test pin 104. The other end of the first voltage sensor 121 and the other end of the second voltage sensor 122 may be connected to the fourth test pin 104 in common. The second voltage sensor 122 is configured to detect a second diagnosis voltage $V_2$ generated between the second test point 42 and the fourth test point 44, and output a voltage signal indicating the detected second diagnosis voltage $V_2$ to the control unit 130.

The control unit 130 is operably coupled to the voltage source 110, the first voltage sensor 121, the second voltage sensor 122 and the information output unit 140. The control unit 130 may communicate with each of the voltage source 110, the first voltage sensor 121, the second voltage sensor 122 and the information output unit 140 via a wired network such as Local Area Network (LAN), Controller Area Network (CAN) and daisy chain, or a local area wireless network such as Bluetooth, Zigbee and WiFi.

The control unit 130 may be, in hardware, implemented to include at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. The control unit 130 may have a memory device embedded therein, and the memory device may be, for example, RAM, ROM, register, hard disk, an optical recording medium or a magnetic recording medium. The memory device may store, update and/or delete programs including various control logics that are executed by the control unit 130, and/or data generated by the control logics when executed.

The control unit 130 is configured to output the ON command to the voltage source 110 to induce the voltage source 110 to output the test voltage, and collect each of the voltage signal from the first voltage sensor 121 and the voltage signal from the second voltage sensor 122 from a time point (hereinafter referred to as 'initial time point')

when the voltage source 110 started to output the test voltage in response to the ON command. The control unit 130 determines whether at least one of the first capacitor 31 and the second capacitor 32 has an open-circuit fault based on at least one of the first diagnosis voltage $V_1$ indicated by the voltage signal from the first voltage sensor 121 and the second diagnosis voltage $V_2$ indicated by the voltage signal from the second voltage sensor 122, then transmits a diagnosis message indicating the determination result to the information output unit 140. That is, the diagnosis message may indicate that an open-circuit fault of either the first capacitor 31 or the second capacitor 32 or both occurred, or an open-circuit fault of both the first capacitor 31 and the second capacitor 32 did not occur.

The information output unit 140 may be implemented using a known device that outputs information visibly or audibly, such as, for example, a display and a speaker. The information output unit 140 is configured to output at least one of the visual information and the audible information corresponding to the diagnosis message transmitted by the control unit 130.

The control unit 130 monitors changes in each of the first diagnosis voltage $V_1$ and the second diagnosis voltage $V_2$ over time while the test voltage is being applied onto the third test point 43 in real time by measuring the time elapsed from the initial time point.

Figure 2:
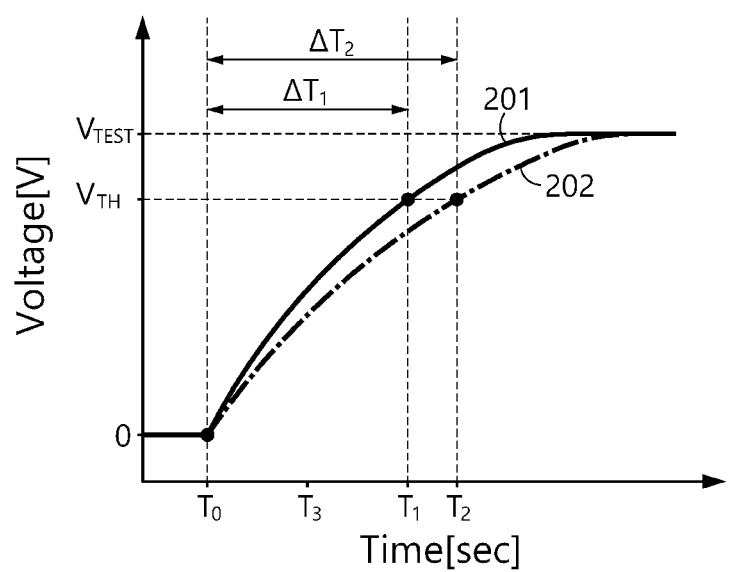
FIG. 2 is a graph showing changes in a first diagnosis voltage and a second diagnosis voltage over time when an open-circuit fault did not occur in a first capacitor and a second capacitor included in the circuit board of FIG. 1.

FIG. 2 is a graph showing changes in the first diagnosis voltage V1 and the second diagnosis voltage V2 over time when an open-circuit fault did not occur in the first capacitor 31 and the second capacitor 32 included in the circuit board 10 of FIG. 1.

Referring to FIGS. 1 and 2, a curve 201 indicated as the solid line indicates changes in the first diagnosis voltage $V_1$, and a curve 202 indicated as the dashed line indicates changes in the second diagnosis voltage $V_2$. While the voltage source 110 is applying the test voltage $V_{TEST}$ onto the third test point 43, the first capacitor 31 is gradually charged by the current $I_1$, and the second capacitor 32 is gradually charged by the current $I_2$.

Accordingly, each of the first diagnosis voltage $V_1$ and the second diagnosis voltage $V_2$ gradually increases from the initial time point $T_0$ when the voltage source 110 starts to apply the test voltage $V_{TEST}$ onto the third test point 43. The first diagnosis voltage $V_1$ is equal to the sum of voltage generated across the second resistor 22 and the second diagnosis voltage $V_2$. Accordingly, from the initial time point $T_0$ until the second diagnosis voltage $V_2$ equals the first diagnosis voltage $V_1$ (i.e., until $I_2=0$ A), the first diagnosis voltage $V_1$ is always higher than the second diagnosis voltage $V_2$, and the second diagnosis voltage $V_2$ increases in pursuit of the first diagnosis voltage $V_1$.

Referring to FIGS. 1 and 2, the control unit 130 may record a time point $T_1$ when the first diagnosis voltage $V_1$ reaches a threshold voltage $V_{TH}$, and optionally, may record a time point $T_2$ when the second diagnosis voltage $V_2$ reaches the threshold voltage $V_{TH}$. The threshold voltage $V_{TH}$ is preset as being higher than 0 V and lower than the test voltage $V_{TEST}$. For example, when the test voltage $V_{TEST}$ is 2 V, the threshold voltage $V_{TH}$ may be 1.8 V that is 90% of the test voltage $V_{TEST}$.

The control unit 130 may compare an elapsed period $\Delta T_1$ from the initial time point $T_0$ to the time point $T_1$ with a preset first threshold period. Optionally, the control unit 130 may compare an elapsed period $\Delta T_2$ from the initial time point $T_0$ to the time point $T_2$ with a preset second threshold period. As described above, because the second diagnosis voltage $V_2$ increases more slowly than the first diagnosis voltage $V_1$, the second threshold period is preset as being longer than the first threshold period.

As shown in FIG. 2, when the elapsed period $\Delta T_1$ is equal to or longer than the first threshold period, or the elapsed period $\Delta T_2$ is equal to or longer than the second threshold period, the control unit 130 may determine that the first capacitor 31 and the second capacitor 32 do not have an open-circuit fault, and output a first diagnosis message. The first diagnosis message indicates that neither the first capacitor 31 nor the second capacitor 32 has an open-circuit fault.

Hereinafter, resistance of the first resistor 21 is defined as R1, resistance of the second resistor 22 as R2, capacitance of the first capacitor 31 as C1, and capacitance of the second capacitor 32 as C2.

Figure 3:
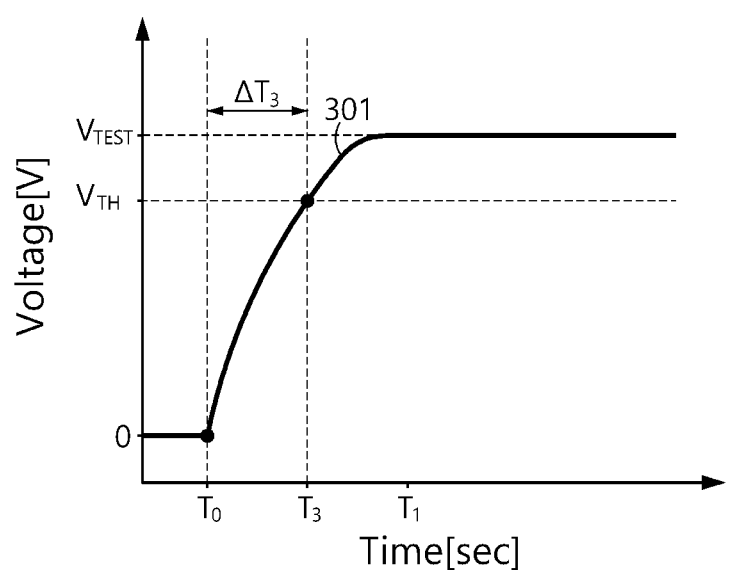
FIG. 3 is a graph showing changes in a first diagnosis voltage V1 and a second diagnosis voltage over time when an open-circuit fault of only the second capacitor occurred among the first capacitor and the second capacitor included in the circuit board of FIG. 1.

FIG. 3 is a graph showing changes in the first diagnosis voltage V1 and the second diagnosis voltage V2 over time when an open-circuit fault of only the second capacitor 32 occurred among the first capacitor 31 and the second capacitor 32 included in the circuit board 10 of FIG. 1.

Referring to FIGS. 1 and 3, a curve 301 indicates changes in the first diagnosis voltage $V_1$. When the second capacitor 32 has an open-circuit fault, the current cannot flow through the second resistor 22 and the second capacitor 32 (i.e., $I_2=0$ A), and thus no voltage is generated across the second resistor 22. That is, the first resistor 21, the second resistor 22, the first capacitor 31 and the second capacitor 32 shown in FIG. 1 cannot act as the second-order RC filter any longer, and act as a first-order RC filter including the first resistor 21 and the first capacitor 31. In this case, the potential of the first test point 41 and the potential of the second test point 42 are kept equal, so the curve 301 also indicates changes in the second diagnosis voltage $V_2$. That is, the first diagnosis voltage $V_1$ and the second diagnosis voltage $V_2$ increase according to the following Equation 1 from the initial time point $T_0$.

$$V_1 = V_2 = V_{TEST} - V_{TEST}e^{-\frac{t-T_0}{\tau_1}} \qquad \langle\text{Equation 1}\rangle$$

In Equation 1, $\tau_1$ denotes the time constant of the first-order RC filter including the first resistor 21 and the first capacitor 31, and is equal to R1×C1.

Meanwhile, the current $I_2$ of 0A signifies that the current $I_1$ is equal to the current $I_0$. Accordingly, when the second capacitor 32 has an open-circuit fault, the first capacitor 31 is charged faster than otherwise (see FIG. 2), and thus, the first diagnosis voltage $V_1$ and the second diagnosis voltage $V_2$ increase rapidly toward the test voltage $V_{TEST}$. As a result, the first diagnosis voltage $V_1$ and the second diagnosis voltage $V_2$ simultaneously reach the threshold voltage $V_{TH}$ at a time point $T_3$ that is earlier than the time point $T_1$.

The control unit 130 may compare the elapsed period $\Delta T_3$ from the initial time point $T_0$ to the time point $T_3$ with each of the first threshold period and a first monitoring period. The first monitoring period may be preset as being shorter than the first threshold period.

As shown in FIG. 3, when the elapsed period $\Delta T_3$ is shorter than the first threshold period and is equal to or longer than the first monitoring period, the control unit 130 may determine that only the second capacitor 32 occurred among the first capacitor 31 and the second capacitor 32 has an open-circuit fault, and output a second diagnosis message. The second diagnosis message indicates that an open-circuit fault of the second capacitor 32 occurred.

Additionally, as shown in FIG. 3, when the elapsed period $\Delta T_3$ is shorter than the first threshold period and the first diagnosis voltage $V_1$ and the second diagnosis voltage $V_2$ reach the threshold voltage $V_{TH}$ at the same time point, the control unit 130 may determine that at least the second capacitor 32 among the first capacitor 31 and the second capacitor 32 has an open-circuit fault.

Figure 4:
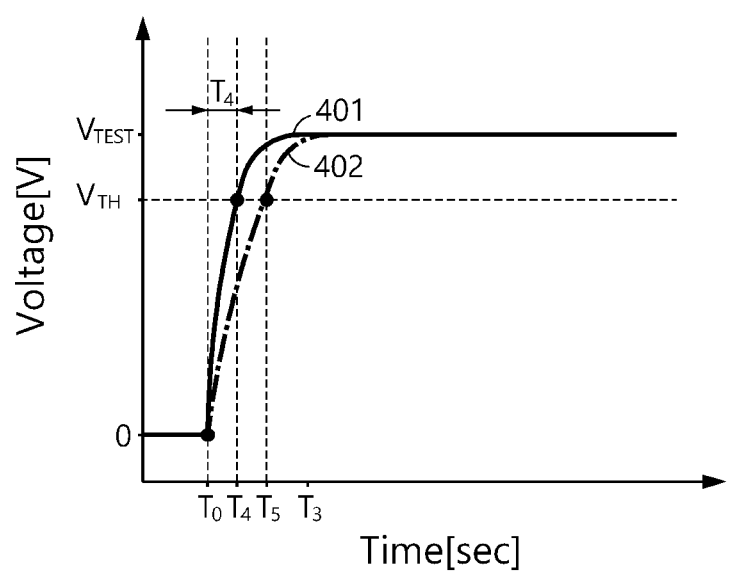
FIG. 4 is a graph showing changes in a first diagnosis voltage V1 and a second diagnosis voltage over time when an open-circuit fault of only the first capacitor occurred among the first capacitor and the second capacitor included in the circuit board of FIG. 1.

FIG. 4 is a graph showing changes in the first diagnosis voltage V1 and the second diagnosis voltage V2 over time when an open-circuit fault of only the first capacitor 31 occurred among the first capacitor 31 and the second capacitor 32 included in the circuit board 10 of FIG. 1.

Referring to FIG. 4, a curve 401 indicated as the solid line indicates changes in the first diagnosis voltage $V_1$, and a curve 402 indicated as the dashed line indicates changes in the second diagnosis voltage $V_2$. When the first capacitor 31 has an open-circuit fault, the current $I_1$ is 0 A, so the current $I_2$ is equal to the current $I_0$. That is, the first resistor 21, the second resistor 22, the first capacitor 31 and the second capacitor 32 shown in FIG. 1 cannot act as the second-order RC filter any longer, and only act as a first-order RC filter including the first resistor 21, the second resistor 22 and the second capacitor 32. Accordingly, the first diagnosis voltage $V_1$ changes according to the following Equation 2, and the second diagnosis voltage $V_2$ changes according to the following Equation 3.

$$V_1 = V_{TEST} - V_{TEST}\left(\frac{\tau_2 - R_2 C_2}{\tau_2}\right) e^{-\frac{t-T_0}{\tau_2}} \qquad \langle\text{Equation 2}\rangle$$

$$V_2 = V_{TEST} - V_{TEST} e^{-\frac{t-T_0}{\tau_2}} \qquad \langle\text{Equation 3}\rangle$$

In Equations 2 and 3, $\tau_2$ is the time constant of the first-order RC filter including the first resistor 21, the second resistor 22 and the second capacitor 32, and is equal to (R1+R2)×C2. Those skilled in the art will easily understand that when $\tau_2$ is smaller than $\tau_1$, the first diagnosis voltage $V_1$ and the second diagnosis voltage $V_2$ will increase toward the test voltage $V_{TEST}$ rapidly as shown in FIG. 4 compared to when only the second capacitor 32 has an open-circuit fault (see FIG. 3). That is, a time point $T_4$ when the first diagnosis voltage $V_1$ reaches the threshold voltage $V_{TH}$ is earlier than a time point $T_5$ when the second diagnosis voltage $V_2$ reaches the threshold voltage $V_{TH}$, and the time point $T_5$ is earlier than the time point $T_3$ of FIG. 2.

The control unit 130 may compare the elapsed period $\Delta T_4$ from the initial time point $T_0$ to the time point $T_4$ with each of the first monitoring period and a second monitoring period. The second monitoring period may be preset as being shorter than the first monitoring period.

When the elapsed period $\Delta T_4$ is shorter than the first monitoring period and is equal to or longer than the second monitoring period, the control unit 130 may determine that only the first capacitor 31 occurred among the first capacitor 31 and the second capacitor 32 has an open-circuit fault, and output a third diagnosis message. The third diagnosis message indicates that an open-circuit fault of the first capacitor 31 occurred.

Figure 5:
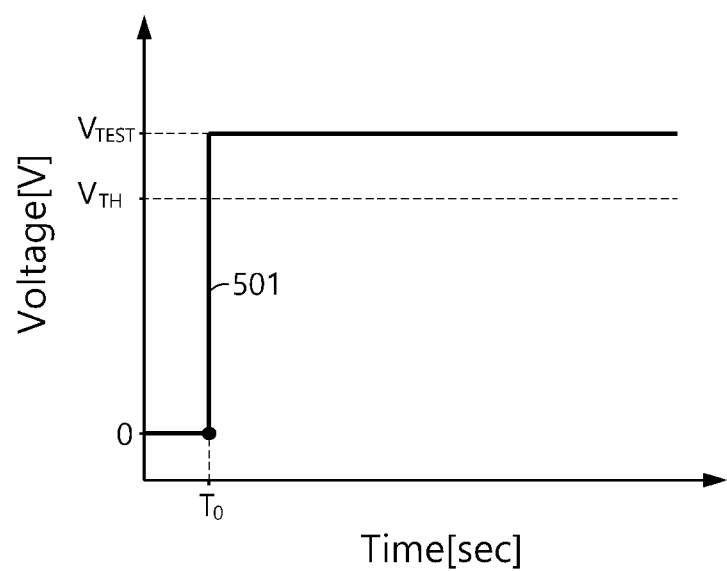
FIG. 5 is a graph showing changes in a first diagnosis voltage and a second diagnosis voltage over time when both the first capacitor and the second capacitor included in the circuit board of FIG. 1 have an open-circuit fault.

FIG. 5 is a graph showing changes in the first diagnosis voltage V1 and the second diagnosis voltage $V_2$ over time when both the first capacitor 31 and the second capacitor 32 included in the circuit board 10 of FIG. 1 have open-circuit fault.

Referring to FIG. 5, a curve 501 indicates changes in the first diagnosis voltage $V_1$ and the second diagnosis voltage $V_2$. When both the first capacitor 31 and the second capacitor 32 have an open-circuit fault, the current can flow through none of the first resistor 21, the second resistor 22, the first capacitor 31 and the second capacitor 32 (i.e., $I_1=I_2=0$ A), and thus no voltage is generated across the first resistor 21 and no voltage is generated across the second resistor 22. Accordingly, the first diagnosis voltage $V_1$ and the second diagnosis voltage $V_2$ simultaneously reach the test voltage $V_{TEST}$ immediately after the initial time point $T_0$.

When the elapsed period from the initial time point $T_0$ to the time point when at least one of the first diagnosis voltage $V_1$ and the second diagnosis voltage $V_2$ reaches the threshold voltage $V_{TH}$ or the test voltage $V_{TEST}$ is shorter than the second monitoring period, the control unit 130 may determine that both the first capacitor 31 and the second capacitor 32 have an open-circuit fault, and output a fourth diagnosis message. The fourth diagnosis message indicates that an open-circuit fault of both the first capacitor 31 and the second capacitor 32 occurred.

Figure 6:
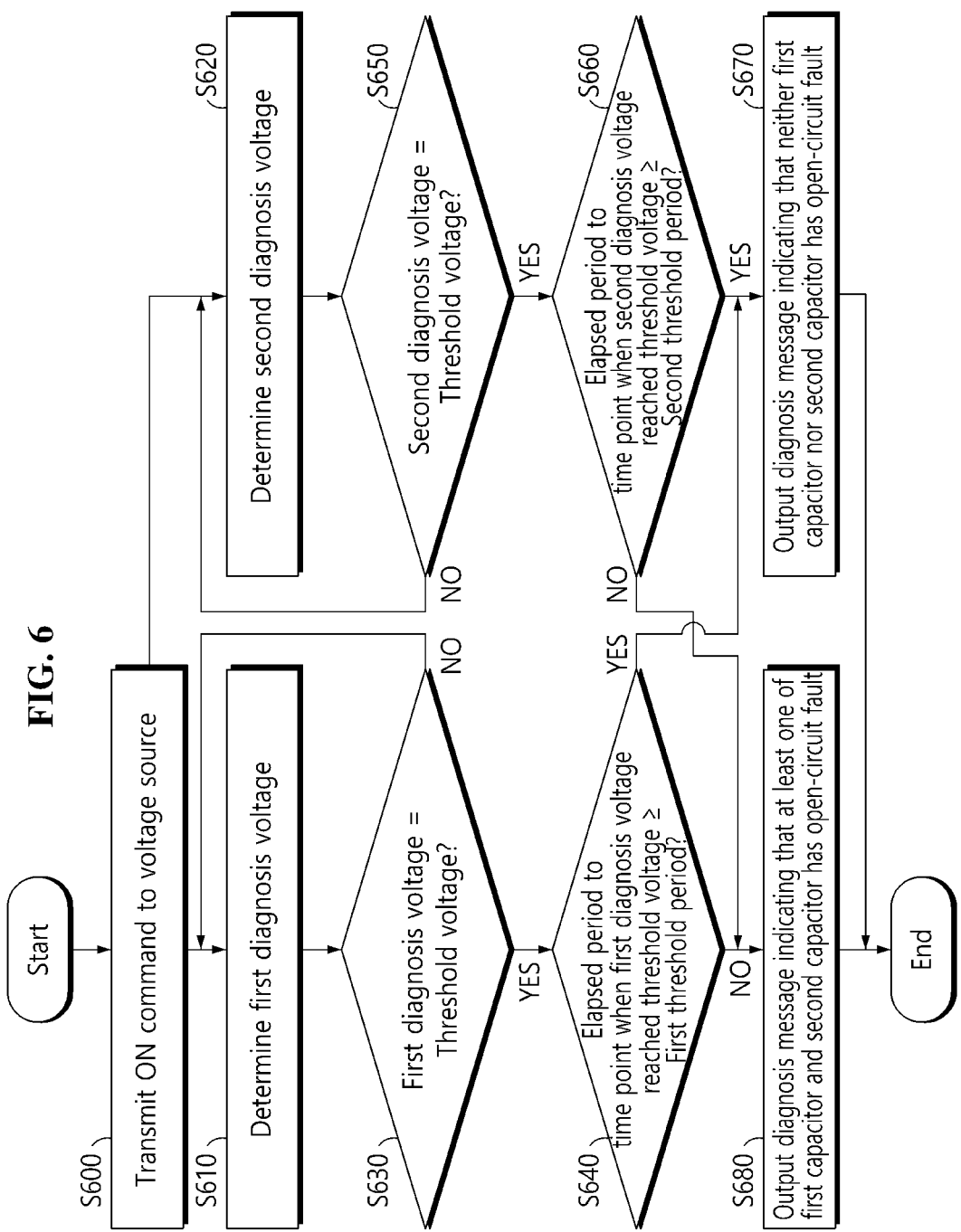
FIG. 6 is a flowchart showing a method for testing a circuit board included in a battery management system according to another embodiment of the present disclosure.

FIG. 6 is a flowchart showing a method for testing the circuit board 10 included in the battery management system according to another embodiment of the present disclosure.

Referring to FIGS. 1 to 6, in step 600, the control unit 130 transmits the ON command to the voltage source 110. In response to the ON command, the voltage source 110 applies the test voltage $V_{TEST}$ onto the third test point 43 from the initial time point.

In step 610, the control unit 130 determines the first diagnosis voltage $V_1$ based on the voltage signal from the first voltage sensor 121.

In step 620, the control unit 130 determines the second diagnosis voltage $V_2$ based on the voltage signal from the second voltage sensor 122.

In step 630, the control unit 130 determines whether the first diagnosis voltage $V_1$ reached the threshold voltage $V_{TH}$. When a value of the step 630 is "YES", the control unit 130 records the time point when the first diagnosis voltage $V_1$ reached the threshold voltage $V_{TH}$ and then may perform step 640. When the value of the step 630 is "NO", the method may revert to the step 610.

In step 640, the control unit 130 determines whether the elapsed period from the initial time point to the time point when the first diagnosis voltage $V_1$ reached the threshold voltage $V_{TH}$ is equal to or longer than the first threshold period. When a value of the step 640 is "YES", step 670 may be performed. When the value of the step 640 is "NO", step 680 may be performed.

In step 650, the control unit 130 determines whether the second diagnosis voltage $V_2$ reached the threshold voltage $V_{TH}$. When a value of the step 650 is "YES", the control unit 130 records the time point when the second diagnosis voltage $V_2$ reached the threshold voltage $V_{TH}$, and then may perform step 660. When the value of the step 650 is "NO", the method may revert to the step 610.

In step 660, the control unit 130 determines whether the elapsed period from the initial time point to the time point when the second diagnosis voltage $V_2$ reached the threshold voltage $V_{TH}$ is equal to or longer than the second threshold period. When a value of the step 660 is "YES", step 670 may be performed. When the value of the step 660 is "NO", step 680 may be performed.

In step 670, the control unit 130 outputs a diagnosis message indicating that both the first capacitor 31 and the second capacitor 32 do not have an open-circuit fault.

In step 680, the control unit 130 outputs a diagnosis message indicating that at least one of the first capacitor 31 and the second capacitor 32 has an open-circuit fault.

Figure 7:
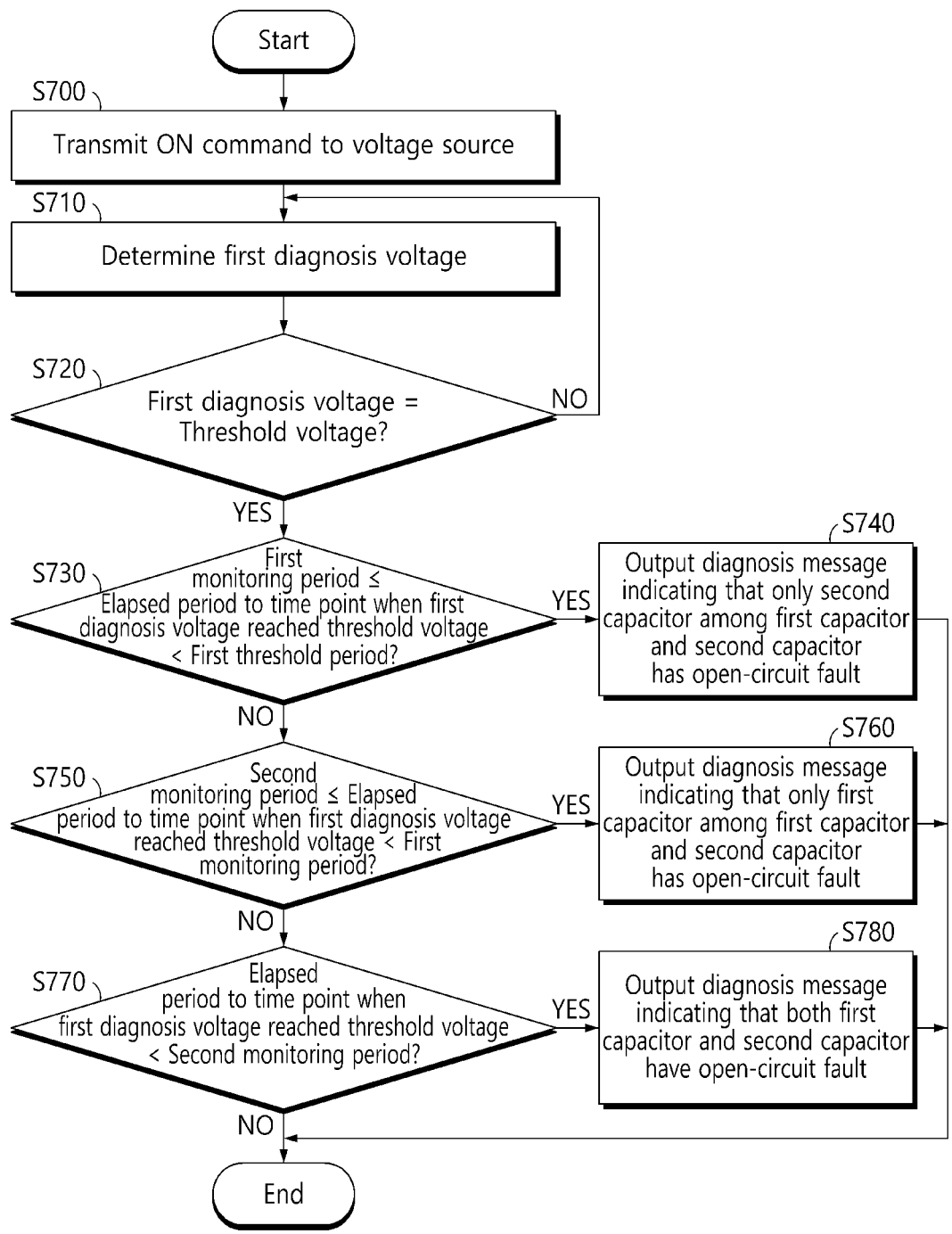
FIG. 7 is a flowchart showing a method for testing a circuit board included in a battery management system according to still another embodiment of the present disclosure.

FIG. 7 is a flowchart showing a method for testing the circuit board 10 included in the battery management system according to still another embodiment of the present disclosure.

Referring to FIGS. 1 to 5 and 7, in step 700, the control unit 130 transmits the ON command to the voltage source 110. In response to the ON command, the voltage source 110 applies the test voltage $V_{TEST}$ onto the third test point 43 from the initial time point.

In step 710, the control unit 130 determines the first diagnosis voltage $V_1$ based on the voltage signal from the first voltage sensor 121.

In step 720, the control unit 130 determines whether the first diagnosis voltage $V_1$ reached the threshold voltage $V_{TH}$. When a value of the step 720 is "YES", the control unit 130 records the time point when the first diagnosis voltage $V_1$ reached the threshold voltage $V_{TH}$, and then may perform step 730. When the value of the step 720 is "NO", the method may revert to the step 710.

In step 730, the control unit 130 determines whether the elapsed period from the initial time point to the time point when the first diagnosis voltage $V_1$ reached the threshold voltage $V_{TH}$ is shorter than the first threshold period and is equal to or longer than the first monitoring period. When a value of the step 730 is "YES", step 740 may be performed. When the value of the step 730 is "NO", step 750 may be performed.

In step 740, the control unit 130 outputs a diagnosis message indicating that only the second capacitor 32 among the first capacitor 31 and the second capacitor 32 has an open-circuit fault.

In step 750, the control unit 130 determines whether the elapsed period from the initial time point to the time point when the first diagnosis voltage $V_1$ reached the threshold voltage $V_{TH}$ is shorter than the first monitoring period and is equal to or longer than the second monitoring period. When a value of the step 750 is "YES", step 760 may be performed. When the value of the step 750 is "NO", step 770 may be performed.

In step 760, the control unit 130 outputs a diagnosis message indicating that only the first capacitor 31 among the first capacitor 31 and the second capacitor 32 has an open-circuit fault.

In step 770, the control unit 130 determines whether the elapsed period from the initial time point to the time point when the second diagnosis voltage $V_2$ reached the threshold voltage $V_{TH}$ is shorter than the second monitoring period. When a value of the step 770 is "YES", step 780 may be performed.

In step 780, the control unit 130 outputs a diagnosis message indicating that both the first capacitor 31 and the second capacitor 32 have an open-circuit fault.

Figure 8:
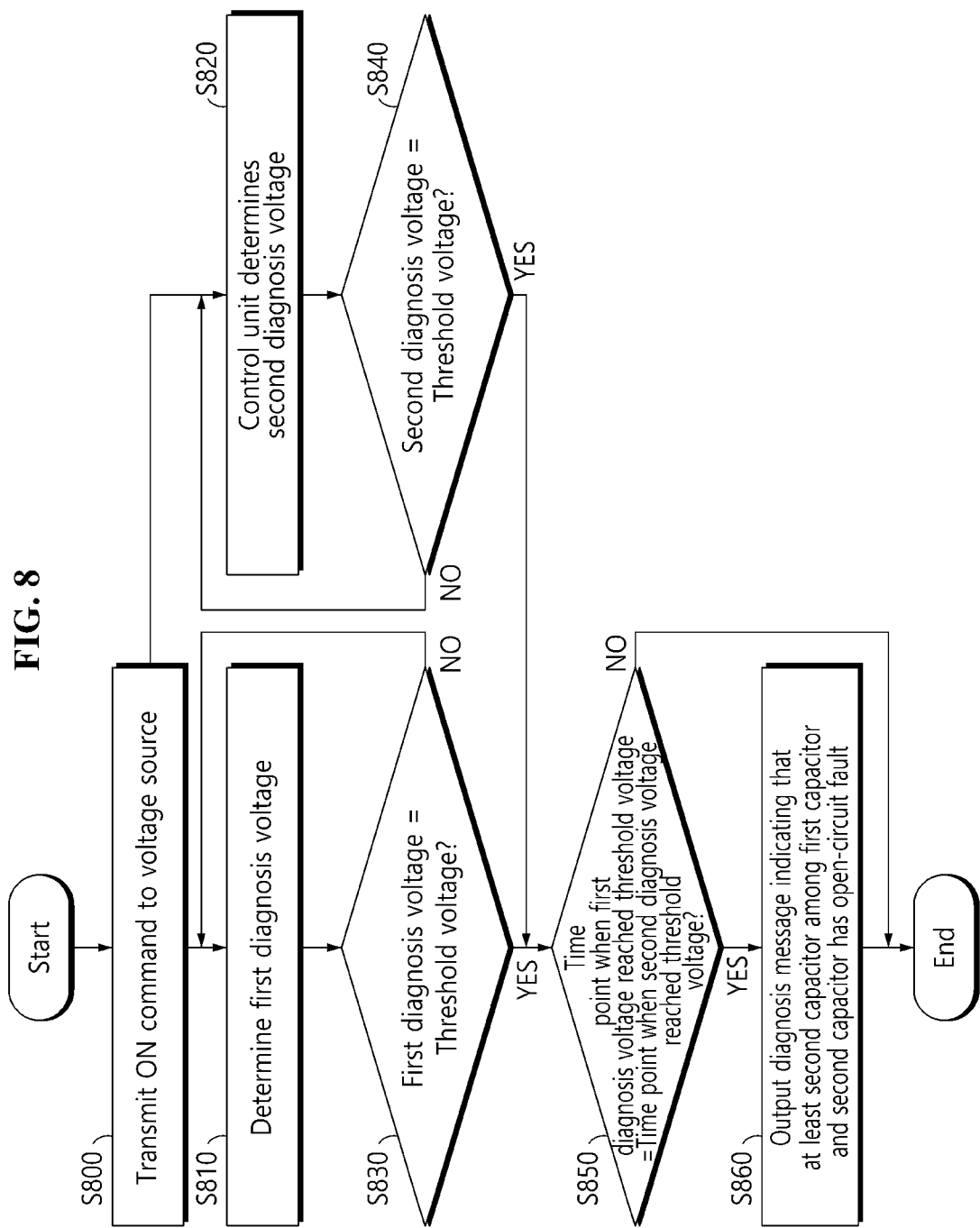
FIG. 8 is a flowchart showing a method for testing a circuit board included in a battery management system according to yet another embodiment of the present disclosure.

FIG. 8 is a flowchart showing a method for testing the circuit board 10 included in the battery management system according to yet another embodiment of the present disclosure.

Referring to FIGS. 1 to 5 and 8, in step 800, the control unit 130 transmits the ON command to the voltage source 110. In response to the ON command, the voltage source 110 applies the test voltage $V_{TEST}$ onto the third test point 43 from the initial time point.

In step 810, the control unit 130 determines the first diagnosis voltage $V_1$ based on the voltage signal from the first voltage sensor 121.

In step 820, the control unit 130 determines the second diagnosis voltage $V_2$ based on the voltage signal from the second voltage sensor 122.

In step 830, the control unit 130 determines whether the first diagnosis voltage $V_1$ reached the threshold voltage $V_{TH}$. When a value of the step 830 is "YES", the control unit 130 records the time point when the first diagnosis voltage $V_1$ reached the threshold voltage $V_{TH}$, and then may perform step 850. When the value of the step 830 is "NO", the method may revert to the step 810.

In step 840, the control unit 130 determines whether the second diagnosis voltage $V_2$ reached the threshold voltage $V_{TH}$. When a value of the step 840 is "YES", the control unit 130 records the time point when the second diagnosis voltage $V_2$ reached the threshold voltage $V_{TH}$, and then may perform step 850. When the value of the step 840 is "NO", the method may revert to the step 820.

In step 850, the control unit 130 determines whether the time point when the first diagnosis voltage $V_1$ reached the threshold voltage $V_{TH}$ is equal to the time point when the second diagnosis voltage $V_2$ reached the threshold voltage $V_{TH}$. When a value of the step 850 is "YES", step 860 may be performed.

In step 860, the control unit 130 outputs a diagnosis message indicating that at least the second capacitor 32 among the first capacitor 31 and the second capacitor 32 has an open-circuit fault.

According to the present disclosure described above, it is possible to test an open-circuit fault of each of the two capacitors 31, 32 mounted on the circuit board 10 without a process of capturing and analyzing an image of the circuit board 10 included in the battery management system. Additionally, it is possible to detect an open-circuit fault of at least one of the two capacitors 31, 32 included in the second-order RC filter by applying a single test signal (i.e., test voltage).

The embodiments of the present disclosure described hereinabove are not implemented only through the apparatus and method, and may be implemented through programs that realize the functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

DESCRIPTION OF REFERENCE NUMERALS

10: Circuit board
21: First resistor
22: Second resistor
31: First capacitor
32: Second capacitor
100: Apparatus
110: Voltage source 121: First voltage sensor
122: Second voltage sensor
130: Control unit
140: Information output unit

What is claimed is:

1. An apparatus for testing a circuit board of a battery management system, wherein the circuit board includes a first resistor; a first capacitor; a second resistor; a second capacitor; a first test point connected to a first end of the first resistor, a first end of the first capacitor and a first end of the second resistor; a second test point connected to a second end of the second resistor and a first end of the second capacitor; a third test point connected to a second end of the first resistor; and a fourth test point connected to a second end of the first capacitor and a second end of the second capacitor, the apparatus comprising:
 a voltage source configured to selectively generate a test voltage;
 a first voltage sensor configured to detect a first diagnosis voltage generated between the first test point and the fourth test point;
 a second voltage sensor configured to detect a second diagnosis voltage generated between the second test point and the fourth test point; and
 a control unit operably coupled to the voltage source, the first voltage sensor and the second voltage sensor, wherein the control unit is configured to:
  control the voltage source to apply the test voltage onto the third test point; and
  determine whether at least one of the first capacitor and the second capacitor has an open-circuit fault based on at least one of the first diagnosis voltage and the second diagnosis voltage.

2. The apparatus according to claim 1, wherein the control unit is configured to:
 record a first time point when the first diagnosis voltage reaches a preset threshold voltage that is lower than the test voltage; and
 determine that both the first capacitor and the second capacitor do not have the open-circuit fault, based on a first elapsed period from an initial time point to the first time point being equal to or longer than a preset first threshold period, wherein the initial time point is a time point when the test voltage starts to be applied onto the third test point.

3. The apparatus according to claim 2, wherein the control unit is configured to determine that the second capacitor has the open-circuit fault and that the first capacitor does not have the open-circuit fault, when based on the first elapsed period being shorter than the first threshold period and equal to or longer than a preset first monitoring period.

4. The apparatus according to claim 3, wherein the control unit is configured to determine that the first capacitor has the open-circuit fault and that the second capacitor does not have the open-circuit fault, based on the first elapsed period being shorter than the first monitoring period and is equal to or longer than a preset second monitoring period.

5. The apparatus according to claim 4, wherein the control unit is configured to determine that both the first capacitor and the second capacitor have the open-circuit fault, based on the first elapsed period being shorter than the second monitoring period.

6. The apparatus according to claim 2, wherein the control unit is configured to:
 record a second time point when the second diagnosis voltage reaches the threshold voltage, and
 determine that at least the second capacitor has the open-circuit fault, based the first time point and the second time point being concurrent.

7. The apparatus according to claim 2, wherein the control unit is configured to:
 record a second time point when the second diagnosis voltage reaches the threshold voltage, and
 determine that both the first capacitor and the second capacitor do not have the open-circuit fault, based a second elapsed period from the initial time point to the second time point being equal to or longer than a second preset threshold period that is longer than the first threshold period.

8. The apparatus according to claim 1, wherein the control unit is configured to output a diagnosis message indicating a result of the determination.

9. A method for testing a circuit board of a battery management system, wherein the circuit board includes a first resistor; a first capacitor; a second resistor; a second capacitor; a first test point connected to a first end of the first resistor, a first end of the first capacitor and a first end of the second resistor; a second test point connected in common to a second end of the second resistor and a first end of the second capacitor; a third test point connected to a second end of the first resistor; and a fourth test point connected to a second end of the first capacitor and a second end of the second capacitor, the method comprising:
 controlling, by a control unit, a voltage source to apply a test voltage onto the third test point;
 recording, by the control unit, a time point when a first diagnosis voltage generated between the first test point and the fourth test point reaches a preset threshold voltage that is lower than the test voltage; and
 outputting a diagnosis message indicating that both the first capacitor and the second capacitor do not have an open-circuit fault, based on an elapsed period from an initial time point to the recorded time point being equal to or longer than a preset first threshold period, wherein the initial time point is a time point when the test voltage starts to be applied onto the third test point.

10. The method according to claim 9, further comprising:
 outputting a diagnosis message indicating that the second capacitor has the open-circuit fault and that the first capacitor does not have the open-circuit fault, based on the elapsed period being shorter than the first threshold period and equal to or longer than a preset first monitoring period.

11. The method according to claim 10, further comprising:
 outputting a diagnosis message indicating that the first capacitor has the open-circuit fault and that the second capacitor does not have the open-circuit fault, based on the elapsed period being shorter than the first monitoring period and is-equal to or longer than a preset second monitoring period.

12. The method according to claim 11, further comprising:
 outputting a diagnosis message indicating that both the first capacitor and the second capacitor have the open-circuit fault, based on the elapsed period being shorter than the second monitoring period.

* * * * *